(12) United States Patent
Nukui (10) Patent No.: US 9,170,304 B2
(45) Date of Patent: Oct. 27, 2015

(54) METHOD FOR ESTIMATING A QUANTITY OF A STATE OF A BATTERY

(75) Inventor: Katsuya Nukui, Tokyo (JP)

(73) Assignee: THE FURUKAWA ELECTRIC CO., LTD, Tokyo (JP)

( * ) Notice: Subject to any disclaimer, the term of this patent is extended or adjusted under 35 U.S.C. 154(b) by 649 days.

(21) Appl. No.: 12/420,945

(22) Filed: Apr. 9, 2009

(65) Prior Publication Data

US 2009/0256524 A1 Oct. 15, 2009

(30) Foreign Application Priority Data

Apr. 11, 2008 (JP) ................................ 2008-103925

(51) Int. Cl.
*H02J 7/00* (2006.01)
*G01R 31/36* (2006.01)

(52) U.S. Cl.
CPC ........ *G01R 31/3648* (2013.01); *G01R 31/3606* (2013.01); *G01R 31/3624* (2013.01);
(Continued)

(58) Field of Classification Search
CPC ............. G01R 31/3606; G01R 31/362; G01R 31/3624; G01R 31/3634; G01R 31/3637
USPC .................................... 320/132; 324/426, 427
See application file for complete search history.

(56) References Cited

U.S. PATENT DOCUMENTS 6,366,054 B1 * 4/2002 Hoenig et al. ................ 320/132
6,456,988 B1 9/2002 Singh et al.
(Continued)

FOREIGN PATENT DOCUMENTS

EP 1324062 A2 7/2003
EP 1887370 A1 2/2008
(Continued)

OTHER PUBLICATIONS

European Search Report dated Dec. 27, 2011 for EP Application No. 09157720.5-2216 / 2108972, 7 pages.
(Continued)

*Primary Examiner* — Yalkew Fantu
*Assistant Examiner* — Manuel Hernandez
(74) *Attorney, Agent, or Firm* — Amin, Turocy & Watson, LLP (57) ABSTRACT

There is provided a battery state detecting method that detects states by evaluating depletion caused by reaction processes whose speeds are different. Voltage $V_{mes}$, current $I_{mes}$ and temperature $T_{mes}$ of a battery are measured and inputted in Step S1 and it is judged whether or not an absolute value of the measured current Imes is smaller than a current threshold value Ithre in Step S2. $OCV_{20\,hr}$ is estimated from $SOC^{n-1}$ and $SOH^{n-1}$ after the previous discharge/charge based on a stable OCV estimating equation in Step S4 and a difference between the voltage measured value Vmes and the $OCV_{20\,hr}$ is calculated and stored in Step S5. A relaxation function $F''(t)$ is updated corresponding to time t in processes in Steps S6 through S19. $SOH^n$ is calculated by using the updated $F''(t)$ in Step S17 and $SOC^n$ is calculated in Step S19.

9 Claims, 9 Drawing Sheets

(52) U.S. Cl.
CPC ........ *G01R31/3634* (2013.01); *G01R 31/3637* (2013.01); *G01R 31/362* (2013.01); *G01R 31/3679* (2013.01)

(56) References Cited

U.S. PATENT DOCUMENTS

| | | | |
|---|---|---|---|
| 7,525,284 | B2 | 4/2009 | Iwane et al. |
| 2003/0112010 | A1 | 6/2003 | Koch |
| 2003/0169049 | A1* | 9/2003 | Kawaguchi et al. .......... 324/426 |
| 2004/0008031 | A1* | 1/2004 | Arai et al. ..................... 324/429 |
| 2004/0220758 | A1 | 11/2004 | Barsoukov et al. |
| 2006/0208704 | A1 | 9/2006 | Iwane et al. |
| 2006/0261782 | A1 | 11/2006 | Kim et al. |
| 2009/0027056 | A1* | 1/2009 | Huang et al. .................. 324/439 |
| 2009/0030626 | A1 | 1/2009 | Iwane et al. |

FOREIGN PATENT DOCUMENTS

| | | |
|---|---|---|
| JP | 2005106615 | 4/2005 |
| JP | 4015128 B2 | 11/2007 |
| WO | 2006121289 A1 | 11/2006 |

OTHER PUBLICATIONS

European Office Action for Application No. 09 157 720.5-1560 dated Mar. 6, 2014. 5 pgs.

\* cited by examiner

METHOD FOR ESTIMATING A QUANTITY OF A STATE OF A BATTERY

CROSS REFERENCE TO RELATED APPLICATIONS

The application claims priority from a Japanese patent application serial No. 2008-103925, filed on Apr. 11, 2008, the entire content of which is incorporated herein by reference.

TECHNICAL FIELD

The present invention relates to a battery residual capacity detecting method and a battery residual capacity detecting apparatus.

BACKGROUND

Since a vehicle has come to employ many electric devices for travelling lately, an importance of an in-vehicle power source is increasing more and more. Needs on the in-vehicle power source have been limited to perform such functions of starting an engine, operating an air-conditioner and lighting lamps in the past 20 to 30 years. In contrary to that, bi-wiring has spread and even parts of a safety system typified by an electronic parking brake (EPB) have come to be controlled by electricity. Still more, as a measure for improving gas mileage in an effort of saving energy and controlling emission of $CO_2$, it is demanded to provide an idling stop function in stopping for a short period of time at an intersection and the like and to assure its restarting capability. Thus, a variety of functions is demanded on the power source and the battery and corresponding to that, it is desired to improve battery state detecting accuracy.

In such a circumstance, it is an important technology to accurately detect a residual capacity (SOC: state of charge) of the battery in particular for safe and comfortable driving of the vehicle and for realizing an automobile society In which an environment is taken into account, because it is linked with stable operations of the electric devices such as the EPB.

Figure 12:
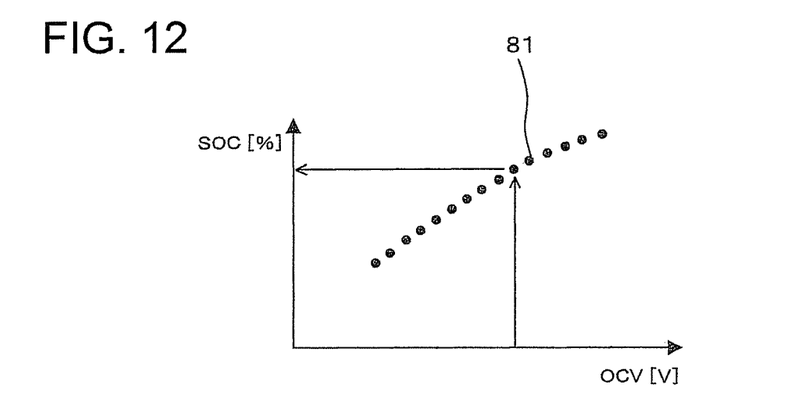
FIG. 12 is a graph showing a relationship of stable open channel voltage and SOC.
Figure 13:
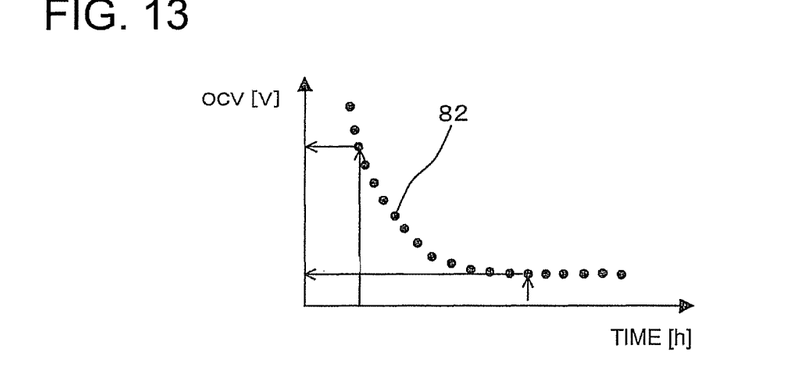
FIG. 13 is a graph showing changes of the OCV when the SOC is constant.
Figure 14:
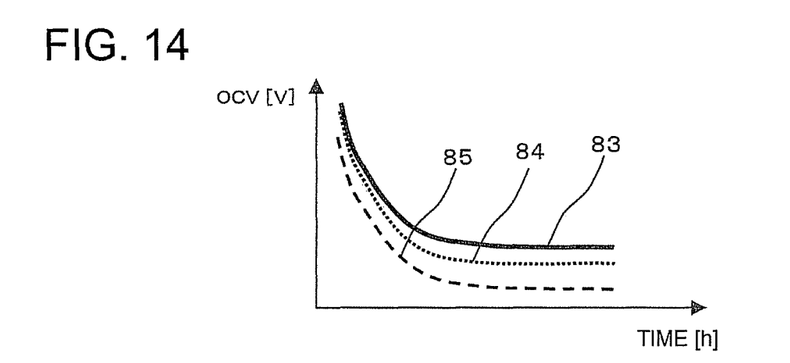
FIG. 14 is a graph showing changes of the OCV when the SOH varies.

Under a battery stable condition, open circuit voltage (OCV) and the SOC thereof have a relationship of correspondence of one-to-one in general (a reference numeral 81 in FIG. 12). However, after discharging and charging electricity, the battery is affected respectively by ion generating and annihilating reactions on a surface of a polar plate due to electro-chemical reactions and by moves of ions due to diffusion and convection of electrolytic solution. Therefore, it takes a time, e.g., around 20 hours, to converge to the stable OCV and the OCV does not correspond one-to-one with the SOC when there is such temporal change. FIGS. 13 and 14 are graphs showing examples of temporal change of the OCV when the SOC and temperature of the battery are constant. FIG. 13 shows that it takes a time until when the OCV (reference numeral 82) is stabilized to a constant value even if the SOC is constant. While FIG. 14 shows changes of the OCVs (reference numerals 83, 84, 85) of batteries whose states of health (SOH) are different, it indicates that the OCVs do not converge to the identical OCV if the SOHs are different even if the SOC and temperature are adjusted so as to fall under the same condition and even if the latest discharge/charge conditions are kept same.

As described above, the influence of the SOH is not reflected in finding the SOC from the OCV by using the state detecting method just by utilizing the latest discharge/charge history. Then, there is a problem that accuracy of state detection drops if the SOC is found from the OVC without reflecting the battery depletion condition.

Patent Document 1 (Japanese Patent Application Laid-open No. Hei.2005-106615 gazette) is known as one exemplary prior art. The Document 1 uses transient response corresponding to discharge/charge history to compensate the OCV as a method for detecting the OCV and SOC of a secondary battery. The Document 1 also refers to the transient response changes corresponding to discharge/charge time and to a resistant component, a polarization component corresponding to internal reaction of the battery and diffusion speed of electrolytic solution.

According to the detection method described in Patent Document 1, it is possible to find depletion corresponding to a fast reaction speed within the battery by measuring a short-period transient response by discharging and charging for a short period of time. However it is unable to measure a long-term transient response, so that it is unable to detect depletion caused by slow reaction speed. Although it is necessary to discharge and charge for a long period of time to measure the long-term transient response, the SOC changes as the discharge/charge time becomes longer and hence the short-term transient response thereafter also changes. Thus, it is unable to detect the depletion corresponding to the different reaction speeds within the battery and to detect the states of the battery such as the residual capacity by the detecting method described in Patent Document 1.

Not only the ion generating and annihilating reactions (fast reaction speed) caused in the vicinity of the polar plate but also ion diffusion speed within the electrolytic solution (slow reaction speed) affects in a series of reaction processes called an electrical-chemical reaction within the battery. The reaction processes whose speeds are different significantly affect the accuracy of the state detection as a factor of error in such reaction system.

SUMMARY

Accordingly, in order to solve those problems, the present invention aims at providing a battery state detecting method for detecting states of a battery by evaluating depletion caused by reaction processes whose speed is different.

According to a first aspect of a battery state detecting method of the invention, the battery state detecting method comprises steps of preparing a relaxation function F(t) for calculating a variation of open circuit voltage (OCV) of the battery after an elapsed time t since the battery has stopped to discharge/charge as a function of predetermined quantity of state of the battery in advance, measuring the OCV variation from OCV during when the battery is stable, optimizing the relaxation function F(t) by the measured OCV variation, estimating the quantity of state from the optimized relaxation function F(t) and detecting the state of the battery based on the estimated quantity of state.

According to another aspect of the battery state detecting method of the invention, the relaxation function F(t) is prepared in advance further as a function of temperature of the battery and the temperature of the battery is measured to use in the relaxation function F(t)

According to a still other aspect of the battery state detecting method of the invention, a stable OCV estimating equation for calculating the OCV during the stable time is prepared in advance and the OCV during the stable time is calculated from the stable OCV estimating equation and a difference from the open circuit voltage measured value of the battery is defined as the OCV variation.

According to a still other aspect of the battery state detecting method of the invention, the OCV during the stable time is OCV when 20 hours has elapsed since the battery has stopped to discharge/charge.

According to a different aspect of the battery state detecting method of the invention, the quantity of state is a residual capacity (SOC) and a level of depletion (SOH) of the battery.

According to a still different aspect of the battery state detecting method of the invention, the relaxation function F(t) is represented by a sum of two or more (m) relaxation functions per reaction speed fi (t) (i=1 through m) prepared in advance corresponding to reaction speeds within the battery and the relaxation function per reaction speed fi (t) (i=1 through m) is optimized by dividing the measured value of the OCV variation into components corresponding to the reaction speeds.

According to another aspect of the battery state detecting method of the invention, the quantity of state is calculated by estimating a quantity of state per reaction speed from the relaxation function per reaction speed fi (t) and by totaling them.

According to another aspect of the battery state detecting method of the invention, the relaxation function per reaction speed fin (t) after the end of the n-th discharge/charge is expressed as: $fi^n(t) fi^{ref}(t) * \{SOC^n/SOC^{ref}\} * \{SOHi^n/SOHi^{ref}\} * g(T)$ (Eq. 1) where the relaxation function per reaction speed fi (t) in the standard state, SOC and SOH per reaction speed are denoted respectively as fi ref (T), $SOC^{ref}$ and $SOHi^{ref}$ and dependency on the temperature T as G (T) (here, SOHi n is SOH per reaction speed).

According to another aspect of the battery state detecting method of the invention, the battery state detecting method comprises steps of at least measuring voltage and current of the battery, calculating an OCV variation corresponding to an elapsed time since said battery has stopped to discharge/charge from the voltage measured value when it is judged that the battery has stopped to discharge/charge from the current or a predetermined discharge/charge stopping signal, optimizing the relaxation function per react ion speed fi (t) corresponding to the reaction speed whose time constant is shorter than the elapsed time by using the OCV variation and estimating the quantity of state by using immediately preceding one for the relaxation function per reaction speed fi(t) corresponding to the reaction speed which is longer than the time constant together with the optimized relaxation function per reaction speed fi(t).

According to another aspect of the battery state detecting method of the invention, the battery is judged to be stopping to discharge/charge when a current value is what permits to judge a transient change within the battery caused by the discharge/charge to be substantially the same with a transient change in a case of open circuit.

According to another aspect of the battery state detecting method of the invention, the battery is judged to be abnormal when the SOC is less than a first threshold value set in advance or when the SOH is more than a second threshold value.

The invention thus provides the battery state detecting method for detecting the state by evaluating the depletion caused by the reaction processes whose speeds are different, so that it becomes possible to detect the state accurately.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

BRIEF DESCRIPTION OF THE REFERENCE NUMERALS

01: BATTERY
02: STATE DETECTING APPARATUS
03: IN-VEHICLE INFORMATION CONTROLLER
20: TEMPERATURE MEASURING MEANS
21: VOLTAGE MEASURING MEANS
22: CURRENT MEASURING MEANS
23: MEMORY AREA (RAM)
24: STATIONARY MEMORY AREA (ROM)
25: PROCESSOR
26: JUDGMENT RESULT OUTPUTTING MEANS
27: IN-VEHICLE STATE INPUTTING MEANS
28: TIMER
50: TRUE VALUE OF $\Delta V$
51, 52, 53, 54: RELAXATION FUNCTION PER REACTION SPEED
55: RELAXATION FUNCTION
61, 62, 63: RELAXATION FUNCTION PER REACTION SPEED
64, 65: RATIO OF RELAXATION FUNCTION PER REACTION SPEED
70: STABLE OCV ESTIMATING EQUATION
81: SOC
82, 83, 84, 85: OCV

DETAILED DESCRIPTION

A battery state detecting method of a preferred embodiment of the invention will be explained in detail with reference to the drawings. It is noted that each component having the same function will be denoted by the same reference numeral to simplify the drawings and their explanation.

The battery state detecting method of the invention evaluates SOH (state of health) which is an index of depletion level of the battery corresponding to reaction speed of the battery and evaluates SOC by using the SOH. Because the SOC has the relationship of one-to-one with the open circuit voltage (OCV) as shown in FIG. 12, the SOC can be found by finding the OCV. However, the relationship of FIG. 12 holds when the state of the battery is stable and the OCV after discharge/charge changes as shown in FIG. 13. Due to that, it is necessary to evaluate the SOC by using the OCV when the battery is fully stabilized after discharging/charging electricity.

Still more, because the OCV after discharge/charge changes by the SOH as shown in FIG. 14, the OCV during the stable period also changes by the SOH. Still more, the transient change of the battery after discharge/charge is affected by the reaction processes whose reaction speed is fast such as ion generating and annihilating reaction and whose reaction speed is slow such as those caused by the move of the electrolytic solution.

Then, in order to be able to accurately evaluate the SOC by evaluating the influence of the slow reaction speed even when an elapsed time after discharge/charge is short f the battery state detecting method of the invention evaluates a variation of the SOH per reaction speed and compensates the OCV by using this SOH.

One embodiment of the battery state detecting method of the invention will be explained below.

At first, the OCV during the stable time after fully elapsing a time since discharge/charge will be expressed as OCVs and the relationship of one-to-one of the SOC and the OCVs shown in FIG. 12 will be expressed by the following equation:

$$SOC=FS\{OCVs(SOC,SOH,T)\} \quad (Eq. 2)$$

$$OCVs(SOC,SOH,T)=lim(V_{mes}(t)).$$

Here, lim described above indicates that the elapsed time t is infinitized with respect to a battery voltage (OCV) measured value $V_{mes}(t)$ after the elapse of time t from the discharge/charge. The OCVs in the above equation also shows that it may be changed by the SOC, SOH and temperature T of the battery. While $V_{mes}(t)$ is also changed by the SOC, SOH and T of the battery during measurement, the equation (2) is expressed only by the time t when it is measured.

In a case of a liquid-type lead battery, the temporal change of Vmes (t) per hour when 20 hours has elapsed becomes as fully small as 10 mV and an error with respect to magnitude of the OCV (about 12.9V) becomes 0.1% or less. Then, $V_{mes}(t)$ when 20 hours has elapsed since the battery has stopped to discharge/charge is expressed as $OCV_{20\ hr}$ in the following equation and it is used for the OCVs:

$$OCV_{20\ hr}=V_{mes}(t=20\ hr)$$

$$OCVs(SOC,SOH,T)=OCV_{20\ hr} \quad (Eq. 3)$$

It is noted that the elapsed time from the stop of the discharge/charge may be a value other than 20 hours depending on types of the battery.

When a variation of the voltage measured value $V_{mes}$ (t) after stopping the discharge/charge from the stable OCV, i.e., an OCV variation, is expressed as $\Delta V(t)$, it can be expressed as follows:

$$\Delta V(t)=Vmes(t)-OCV20\ hr \quad (Eq. 4)$$

This change of voltage $\Delta V(t)$ has been handled while including all transient changes by using a term "polarization" in the conventional definition of electrical-chemistry. However, because $\Delta V(t)$ is a change in voltage caused by a relaxation process until approaching to the stable OCV, it is affected by the following factors of change in voltage. The factors of the change in voltage include a condition of the polar plate, ion concentration in the vicinity of the polar plate, their solid-phase reaction and solid-liquid reaction and moves of ions with deposition, convection and diffusion of the electrolytic solution. $\Delta V(t)$ may be considered to be caused by integrating the relaxation processes whose reaction speeds are different.

$\Delta V(t)$ may be represented by using a function F(t) composed of m polynomial expressions corresponding to the difference of the reaction speeds.

$$\Delta V(t)=F(t)$$

$$=f1(t)+f2(t)+\ldots fm(t)=\Sigma fi(t) \quad (Eq. 5)$$

In the above F(t) (relaxation function), each term fi (t) (relaxation function per reaction speed) represents a contribution to the change in voltage in each relaxation process intrinsic to the battery and each depends on the state of health SOH, the state of charge (ion concentration) SOC and the temperature T of the battery.

The state detecting system has reference data therein in advance before it is connected with the battery. Initial states corresponding to the battery to be connected will be represented as $SOC^O=SOC^{ref}(0)$, $SOHi\ 0=SOHi^{ref}(0)$ and $OCV_{20\ hr}{}^0=OCV_{20\ hr}{}^{ref}(O)$.

Each reference data is used as the initial value in the initial state in which the battery is connected with the state detecting system as n=O-th measurement.

F(t) and each term $f_i(t)$ of the equation (5) representing the OCV variation ~V(t) after the end of n-th discharge/charge after connecting the battery with the state detecting system and setting the initial values will be represented as $F''(t)$ and $fi''(t)$, respectively. At this time, $fi''(t)$ may be calculated by the following equation from the SOC and SOH corresponding to the i-th reaction speed (represented as $SOC''$ and $SOHi''$, respectively):

$$fi''(t)=fi^{ref}(t)*\{SOC''/SOC^{ref}\}*\{SOHi''/SOHi^{ref}\}*g(T) \quad (Eq. 6)$$

Here, $fi^{ref}(t)$, $SOC^{ref}$, and $SOHi^{ref}$ are values in the initial state set in advance (unused state for example) and g(T) is a function indicating temperature dependency.

When the temperature T and the SOC are constant regardless of the time in the equation (6), the $SOHi''$ can be calculated from the following equation:

$$SOHi''=\{fi''(t)/fi^{ref}(t)*SOHi^{ref} \quad (Eq. 7)$$

Accordingly, it is possible to obtain $SOHi''$ by using $fi''(t)$ obtained from the equation (6).

From the equation (7), the overall $SOH''$ to which $SOHi''$ caused by the transient responses whose reaction speeds are different are totaled is composed of respective components as follows:

$$SOH''=(SOH1'',SOH2'',\ldots,SOHm'') \quad (Eq. 8)$$

For instance, when coefficients of m SOHs are A through M, SOHD may be expressed as follows:

$$SOH''=A*SOH1''+B*SOH2''+\ldots+M*SOHm''=A*f_1{}''(t)/f_1{}^{ref}(t)\}SOH_1{}^{ref}+B*\{f_2n(t)/f_2{}^{ref}(t)\}SOH_2{}^{ref}+M*(t)/\{f_m{}^n(t)/f_m{}^{ref}(t)\}SOH_m{}^{ref} \quad (Eq.\ 8')$$

However, the equation (8') is one example in which the relationship of $SOH_1$ through $SOH_m$ shown in the equation (8) is represented in a form of sum. The total of SOHin is not limited to the form of the equation (8') in which $SOH_1$ through SOHm are respectively coupled in that form. It becomes possible to detect the depletion state of the battery by using this $SOH_n$.

However, when the elapsed time from the end of the n-th discharge/charge is short, it is unable to obtain $fi''$ (t) corresponding to the slow reaction speed and to update the $SOC^n$ and $SOH_i^n$. Then, the equation (6) is used approximately as follows by using the values $SOC^{n-1}$ and $SOH_i^{n-1}$ at the end of the discharge/charge of the previous time instead of the $SOC^n$ and $SOH_i^n$ until when $f_i^n$ (t), $SOC^n$ and $SOH_i^n$ corresponding to the slow reaction speed can be calculated.

$$fi^n(t)=fi^{ref}(t)*\{SOC^{n-1}/SOC^{i\,ref}\}*\{SOH^{i^{n-1}}/SOH\,i^{ref}\}*g(T) \quad (Eq.\ 6')$$

Still more, in the state detecting system to which the equation (6') is applicable, the measurement of the relaxation speed of $F''$ (t) can be carried out under the condition in which the discharge/charge of the battery is stopped. It is possible to use $SOC^{n-1}$ for calculation of the relaxation function of $F''$ (t) when operations are always carried out only with discharge/charge which is less than a threshold value. However, when in-vehicle operation conditions are assumed, discharge/charge is carried out along with an operation of the vehicle in measuring n-th times since the end of the n−1-th times and it becomes necessary to compensate the SOC n−1 by $\Delta SOC$ (discharge/charge integrated quantity) as a change of the amount of charge during the operation of the vehicle. In such a case, the following equation (6'') is used by setting as follows:

$$SOC^{(n-1)'}=SOC^{n-1}+\Delta SOC\,fi^n(t)=fi^{ref}(t)*\{SOC^{(n-1)'}/SOC^{ref}\}*\{SOH\,i^{n-1}/SOHi^{ref}\}*g(T) \quad (Eq.\ 6'')$$

$fi''$ (t) is updated by the following equation by using the SOHin calculated by the equation (7) to calculate $SOCi^n$.

$$fi^n(t)=f^{ref}(t)*\{SOC\,i^{n-1}/SOC^{ref}\}*\{SOHi^n/SOHi^{ref}\}*g(T) \quad (Eq.\ 6''')$$

It is possible to calculate OCV20 hr by the following equation from the equations (4) and (6'''):

$$OCV_{20\,hr}=V_{mes}(t)-\Sigma[f^{ref}(t)*\{SOC^{n-1}/SOC^{ref}\}*\{SOHi^{n-1}/SOHi^{ref}\}]*g(T) \quad (Eq.\ 9)$$

It is possible to calculate the $SOC_n$ by substituting this $OCV_{20\,hr}$ in the equation (2) and to use to detect the state of the soc.

As described above, it becomes possible to calculate the m relaxation functions per reaction speed $fi''$ (t) (i=1 through m) after the n-th discharge/charge based on the m reference values $fi^{ref}$ (t) (i=1 through m) corresponding to m kinds of reaction speeds, the m reference depletion parameters $SOHi^{ref}$ (i=1 through m) and the m reference residual capacity parameters $SOC^{ref}$ (i=1 through m). Thereby, it becomes possible to obtain the OCV, SOC and SOH reflecting the level of depletion corresponding to the different reaction speeds and to detect the state accurately.

The battery state detecting method of the present embodiment will be explained below with reference to FIGS. 1 through 7. FIGS. 1 through 7 are flowcharts showing flows of processes of the battery state detecting method of the embodiment.

One exemplary procedure of the state detecting method of the battery (01) of the invention will be explained concretely by exemplifying a case of a battery mounted in a vehicle. As shown in a diagram showing the whole system of FIG. 1, a state detector (02) comprises a means (20) for measuring temperature of the battery (01), a means (21) for measuring voltage of the battery (01), a means (22) for measuring current of the battery (01), a memory area (RAM) (23) for temporarily recording measured values measured by the respective measuring means (20 through 22), a stationary memory area (24) for storing reference data in advance, a processor (25) for detecting and judging the state based on the data stored in the RAM (23) and the ROM (24), a means (26) for outputting a judgment result to the outside, a means (27) capable of inputting information from an in-vehicle information controller (03) and a timer (28) capable of counting time.

Figure 1:
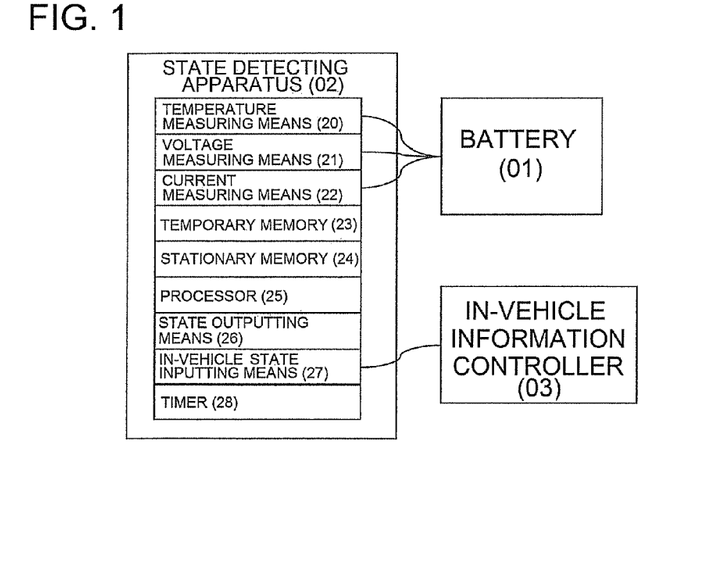
FIG. 1 is a diagram showing an overall structure of a state detecting system using a battery state detecting method of an embodiment of the invention.
Figure 2:
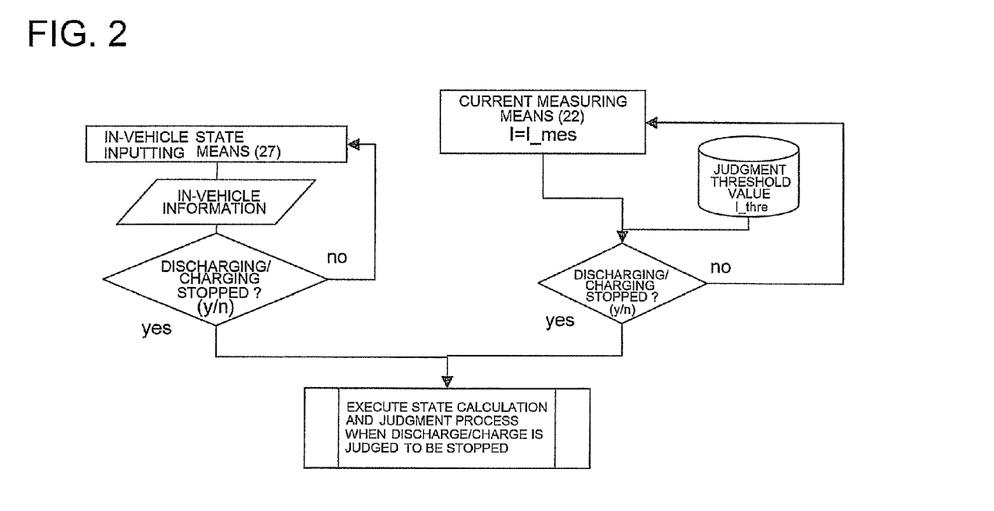
FIG. 2 is a flowchart explaining a process for determining a threshold value in the state detecting method of the embodiment.

According to the invention, the calculation of the quantity of state is executed when it is judged that the battery (01) has stopped to discharge/charge. FIG. 2 shows one exemplary method for judging that the battery (01) has stopped to discharge/charge. This is a case when it is judged that the vehicle is parking or stopping from the information of the in-vehicle information controller (03) or when information on connect and disconnect of the battery (01) and the state detector (02) is inputted for example. Or, this is a case when a current value measured by the current measuring means (22) provided in the state detector (02) becomes a judgment threshold value or less recorded in the stationary memory area (24). The judgment may be made only by the in-vehicle information inputting means (27) or only the judgment of the current threshold value or by freely combining them (the part up to now is referred to as a threshold value judgment means).

When the state detector (02) is connected with the battery (01) is referred to as the initial state, i.e., n=0 (times), and a number of times of judgment when the state is judged that the discharge/charge is stopped by the threshold value judgment means in FIG. 2 is referred to as n times. A counter value of the timer is set to be t_count=0.

According to the battery state detecting method of the present embodiment, the SOC, SOH and OCV20 hr of the battery corresponding to the initial battery state are stored in the stationary memory area (24) in advance by setting the SOC calculation equation of (2) as $SOC^o=SOC^{ref}(0)$, $SOHi^o=SOH^{ref}(O)$ and $OCV_{20\,hr}^o=OCV_{20\,hr}^{ref}(O)$.

Figure 3:
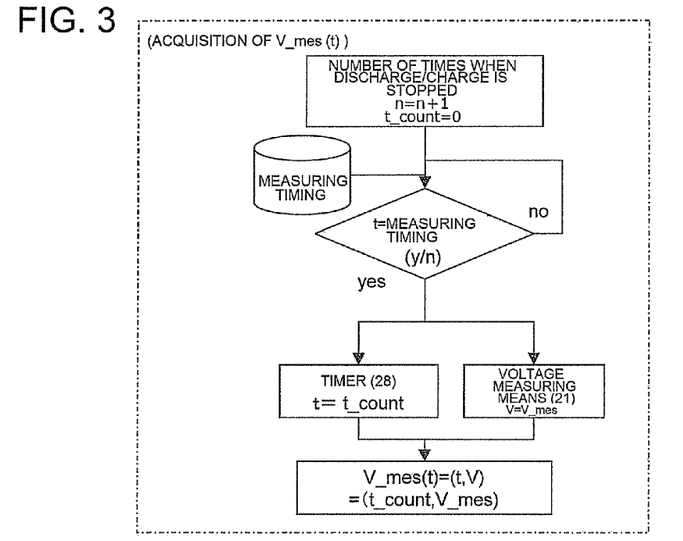
FIG. 3 is a flowchart explaining a method for acquiring a voltage measured value in the state detecting method of the embodiment.

In FIG. 3, the counter value of the timer is confirmed with predetermined confirmation timing. When the timer count (t count) exceeds its measured timing value at the predetermined measuring timing, the current measuring means (22) measures a voltage value $V_{mes}$ of the battery (01). A relationship between time and the voltage at this time is expressed as follows:

$$V_{mes}(t)=(t,V)=(tcount,V_{mes})$$

Then, $V_{mes}(t)-OCV_{20\,hr}$_temp is stored as $\Delta V(t)$_temp (see the equation (4), the acquisition of $V_{mes}(t)$)

Figure 4:
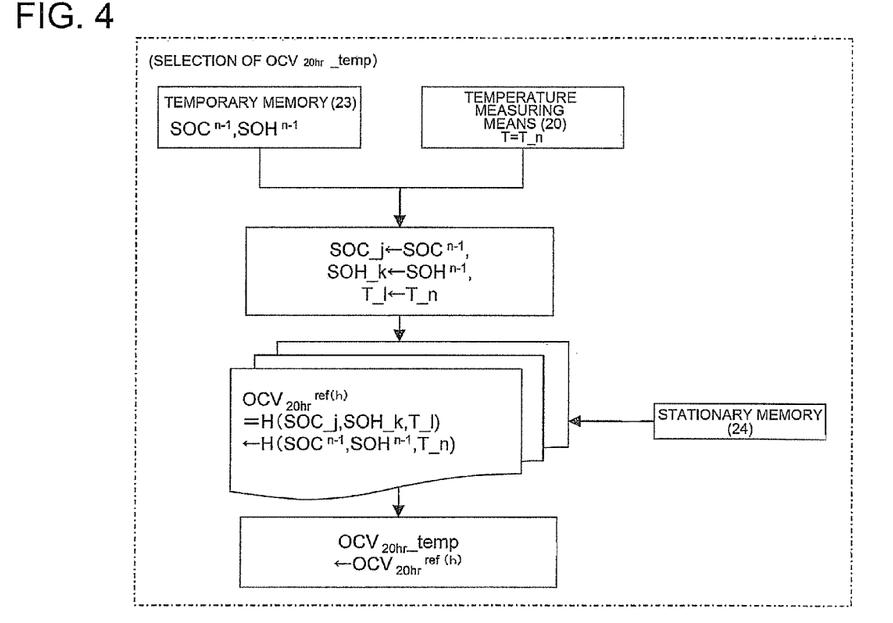
FIG. 4 is a flowchart explaining a method for selecting $OCV_{20\ hr}$ in the state detecting method of the embodiment.

FIG. 4 shows a flow of a method for calculating $OCV_{20\,hr}$_temp. As the SOC and SOH in starting to calculate the n-th state, the previous calculated values $SOC^{n-1}$ and $SOH^{n-1}$ are used. Measured value $T=T^n$ obtained from the temperature measuring means (20) is used as the temperature of the battery at the present time. When an OCV value after 20 hours presumed from this condition is expressed as OCV20 hr temp, the apparatus (02) has the following relational expression in which $OCV_{20\,hr}^{ref}(h)$ is correlated with h kinds of conditions combining a plurality of SOC values, SOH values and T values in advance as the reference data:

H(SOC_j, SOH_k, T__l)$OCV_{20\,hr}^{ref}$(h) (h, j, k, l are natural numbers) $OCV_{20\,hr}^{ref}$ (h) at the present is determined by using this equation. This is used to determine $OCV_{20\,hr}^{ref}$(h) at present. This is one configuration of stable OCV estimating equations. This is used as the n-th time one (selection of $OCV_{20\,hr}$_temp): $OCV_{20\,hr}$_temp=$OCV_{20\,hr}^{ref}$(n)

Figure 5:
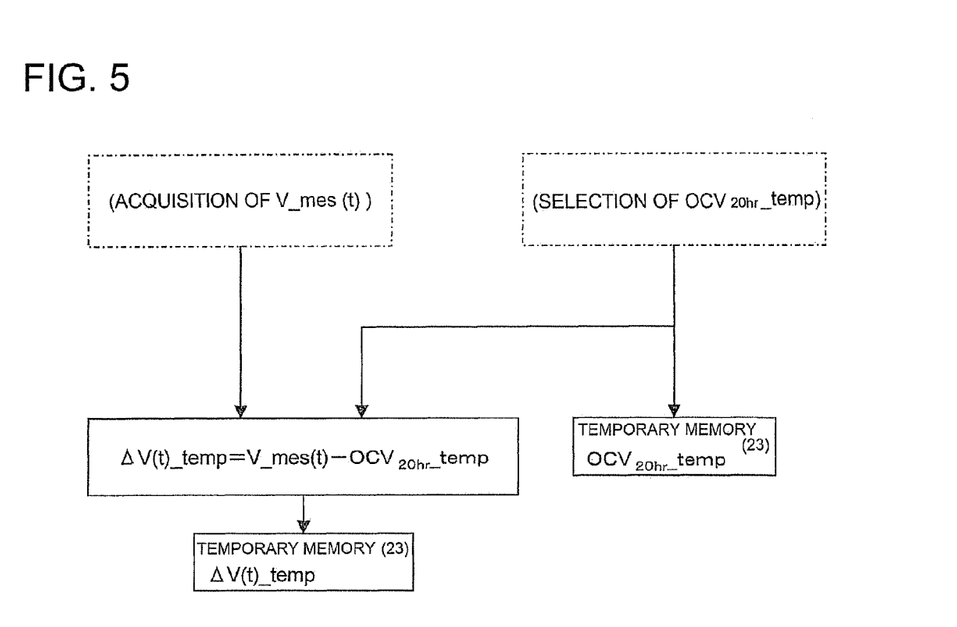
FIG. 5 is a flowchart explaining a method for calculating $\Delta V$ in the state detecting method of the embodiment.

FIG. 5 shows a flow of adding data of $\Delta V(t)$_temp=$V_{mes}(t)-OCV_{20\,hr}$_temp to the temporary memory area (23) per measurement by using $V_{mes}(t)$ calculated by using the voltage measured value in FIG. 3 and $OCV_{20\ hr}$ temp obtained by using the quantity of states SOC, SOH and T in FIG. 4.

Then, fitting calculation is carried out so as to express $\Delta V(t)$ temp calculated in FIG. 5 as a sum of two or more (m) relaxation functions per reaction speed $fi''(t)$ (I=1 through m) prepared as predetermined functional type. In other words, the relaxation function per reaction speed $fi''(t)$ is optimized with respect to the data expressed by $\Delta V(t)$ temp.

Although various calculation methods utilizing regression calculation such as a least-squares method are conceivable as for the fitting method, an error becomes large when the regression calculation is carried out by simply using a sum of exponential functions in this method for calculating $\Delta V(t)$ temp because it turns out as $\Delta V(20\ hr)$ temp=O.

Then, it is desirable to deduct an inclination of a tangent around $\Delta V\ 20\ hr)$ temp=0, to introduce a function by which $\Delta V(20\ hr)$ temp>0 always holds and to carry out fitting to the difference by the sum of the exponential functions.

For simplification, the equation (5) is assumed to be composed of the following four terms hereinafter:

$$F(t)=f\text{fast}(t)+f\text{slow}(t)=\{f\text{fast}1(t)+f\text{fast}2(t)\}+\{f\text{slow}1(t)+f\text{slow}2(t)\} \quad \text{(Eq. 10)}$$

It becomes easy to prepare the optimized function with respect to $\Delta V(t)\_\text{temp}$ by expressing the equation (10) as follows for example as one embodiment:

Function 1 of fast relaxation speed:

$$F\text{fast}1(t)=A^*\exp(-B^*t^\wedge C) \quad \text{(10-1)}$$

Function 2 of fast relaxation speed:

$$F\text{fast}2(t)=D^*\exp(-E^*t^\wedge F) \quad \text{(10-2)}$$

Function 1 of slow relaxation speed:

$$F\text{slow}1(0=G^*\exp(-H^*t^\wedge I) \quad \text{(10-3)}$$

Function 2 of slow relaxation speed:

$$F\text{slow}2(t)=-a/72000^*t+b \quad \text{(10-4)}$$

However, it is possible to use complicated functions or simplified functions depending on conditions such as computing speed of the sensors, an amount of memory and accuracy required to the sensors.

Figure 6:
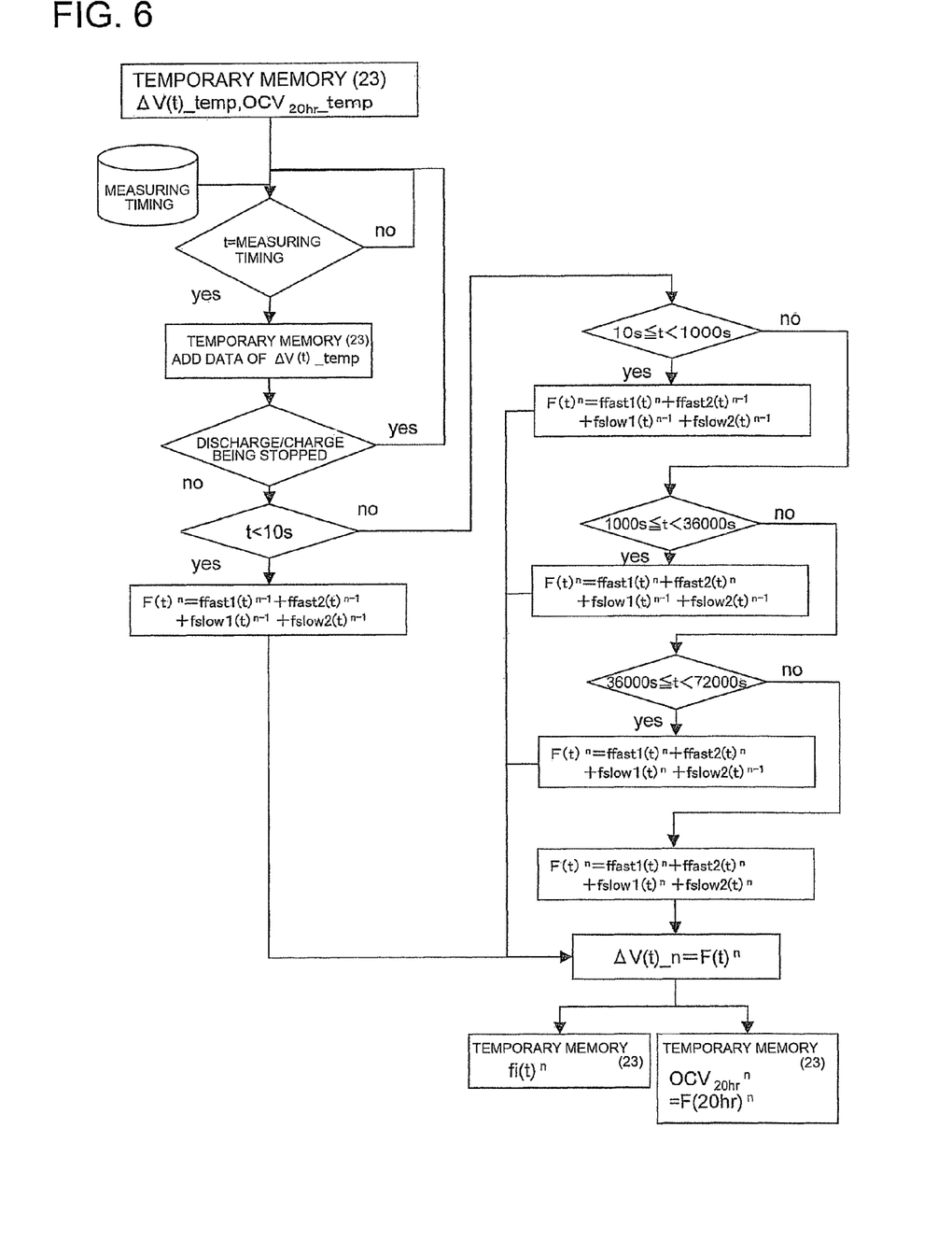
FIG. 6 is a flowchart explaining a method for calculating a relaxation function F in the state detecting method of the embodiment.
Figure 7:
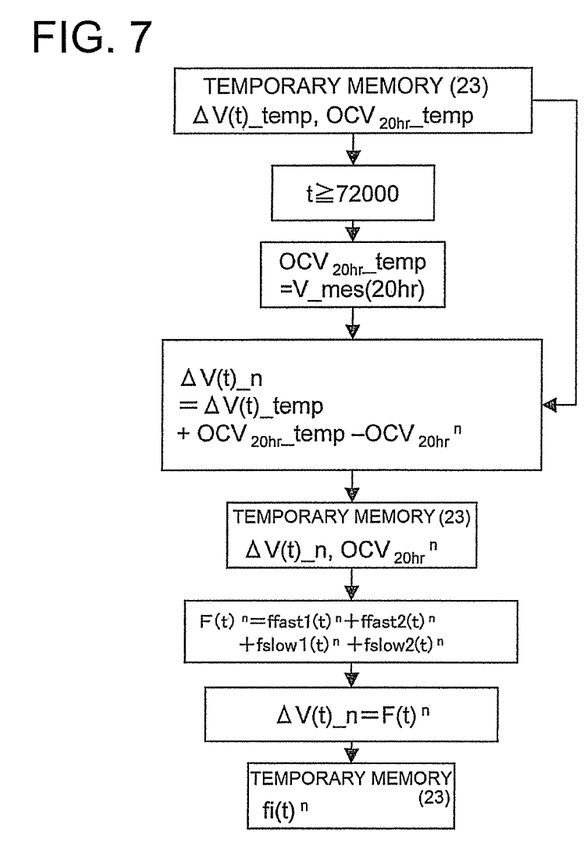
FIG. 7 is a flowchart explaining the relaxation function F in the state detecting method of the embodiment.

FIGS. 6 and 7 illustrate a method for obtaining $F''(t)$ from $6V(t)$ temp corresponding to an elapsed time from the timer count. Each coefficient is defined so that the functions shown in the equations (10-1 through 10-4) are dominant respectively to the four reference times (10 s, 1000 s, 36000 s, 72000 s) as a fitting function in that interval. At this time, the exemplified reference times (10 s, 1000 s, 36000 s, 72000 s) can be determined corresponding to a time constant based on the relaxation speed of the reaction speed within the battery. The reference time can be also changed not only by the relaxation speed within the battery but also by the accuracy required to the sensors and timing corresponding to traveling and resting conditions of an actual car.

As for the determination method of the reference time, it is possible to use a timer within the sensor, to use time of in-vehicle information, typified by car navigation, obtained from the in-vehicle information inputting means or to use their combination.

FIG. 6 illustrates a method for obtaining Fn(t) from $\Delta V(t)\_$temp when the elapsed time of the timer count is shorter than 20 hours. When the time t is judged to be shorter than a first reference time (10 seconds here), $F''(t)$ is calculated by the following equation based on the data after finishing the previous discharge/charge $F^{n-1}(t)$:

$$F''(t)=f\text{fast}1^{n-1}(t)+f\text{fast}2^{n-1}(t)+f\text{slow}1^{n-1}(t)+f\text{slow}2^{n-1}(t)\} \quad \text{(Eq. 11)}$$

In the same manner, when the time t is judged to be longer than the first reference time and shorter than a second reference time (1,000 seconds here), $F''(t)$ is calculated by the following equation based on the data after finishing the previous discharge/charge $F\ n-1\ (t)$ and the latest data:

$$f\text{fast}1^n(t)+f\text{fast}2^{n-1}(t)+f\text{slow}1^{n-1}(t)+f\text{slow}2^{n-1}(t)\} \quad \text{(Eq. 12)}$$

Still more, when the time t is judged to be longer than the second reference time and shorter than a third reference time (36,000 seconds here), r(t) is calculated by the following equation based on the data after finishing the previous discharge/charge $F^{n-1}(t)$ and the latest data:

$$F''(t)=f\text{fast}1^n(t)+f\text{fast}2^n(t)+f\text{slow}1^{n-1}(t)+f\text{slow}2^{n-1}(t) \quad \text{(Eq. 13)}$$

Furthermore, when the time t is judged to be longer than the third reference time and shorter than a fourth reference time (72,000 seconds here), $F''(t)$ is calculated by the following equation based on the data after finishing the previous discharge/charge $F^{n-1}(t)$ and the latest data:

$$Fn(t)=f\text{fast}1^n(t)+f\text{fast}2^n(t)+f\text{slow}1^n(t)+f\text{slow}2^{n-1}(t) \quad \text{(Eq. 14)}$$

Then, t=20 hours is substituted to $F''(t)$ obtained by the equations (11) through (14) to set as follows:

$$OCV_{20\ hr}{}^n=F^n(20\ hr)$$

Thus, $fi''(t)$ and $OCV_{20\ hr}{}^n$ can be obtained by the equations (11) through (15).

In FIG. 7, when the time t is judged to be more than the fourth reference time, e.g., 20 hours, $F''(t)$ is calculated by replacing to the following equation (14-2) based on $OCV_{20\ hr}{}^n$ obtained the latest $V_{mes}$ (20 hr) and the data of $\Delta V(t)\_$temp: $\Delta V(t)''=\Delta V(t)\_\text{temp}+OCV_{20\ hr\_}$temp$-OCV_{20\ hr}{}^n$ (Eq. 14-2)

Then, $F''(t)$ is calculated by the following equation by not obtaining $\Delta V(t)''$ from $F''$ (20 hr) but by replacing with the equation (14-2):

$$Fn(t)=f\text{fast}1^n(t)+f\text{fast}2^n(t)+f\text{slow}1^n(t)+f\text{slow}2^n(t) \quad \text{(Eq. 15)}$$

Figure 8:
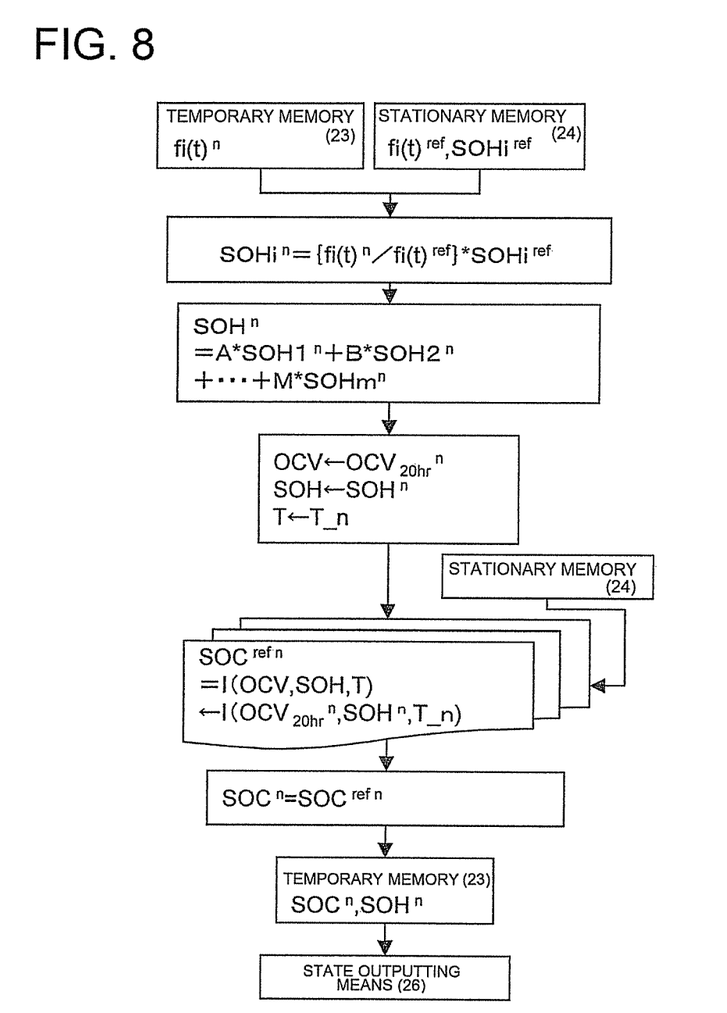
FIG. 8 is a flowchart explaining a method for calculating SOH and SOC in the state detecting method of the embodiment.

In FIG. 8, $SOHi''$ is calculated by using fi(t) calculated in the flows in FIGS. 6 and 7 and stored in the temporary memory area (23) and reference data $fi^{ref}(t)$ and $SOHi^{ref}$ recorded in the stationary memory area (24) in advance.

Next, the calculation is made as $SOC''=SOC^{ref-n}$ by inputting the respective values to the relational expression of H $(OCV_{20\ hr}{}^n, SOH^n, T\_n)=SOC^{ref-n}$ in the stationary memory area (24) by using $OCV=OCV_{20\ hr}{}^n$ obtained in FIGS. 6 and 7, SOH and $SOH''$ obtained in FIG. 8 and T=t_n obtained in FIG. 4.

It becomes possible to detect the states of charge and depletion of the battery by comparing $SOC''$ and $SOH''$ calculated as described above with predetermined threshold values.

The comparison judging means compares $SOC''$ and $SOH''$ with the predetermined threshold values set in advance and judges that the battery is in the depletion state when $SOC''$ is less than the threshold value or when $SOH''$ is more than the threshold value. It is noted that the relationship between the magnitudes of SOH and the depletion level of the battery is reversed depending on system design. In such a case, it is needless to say that it is judged that the battery is in the depletion state when $SOH''$ is less than the predetermined threshold value.

Figure 9:
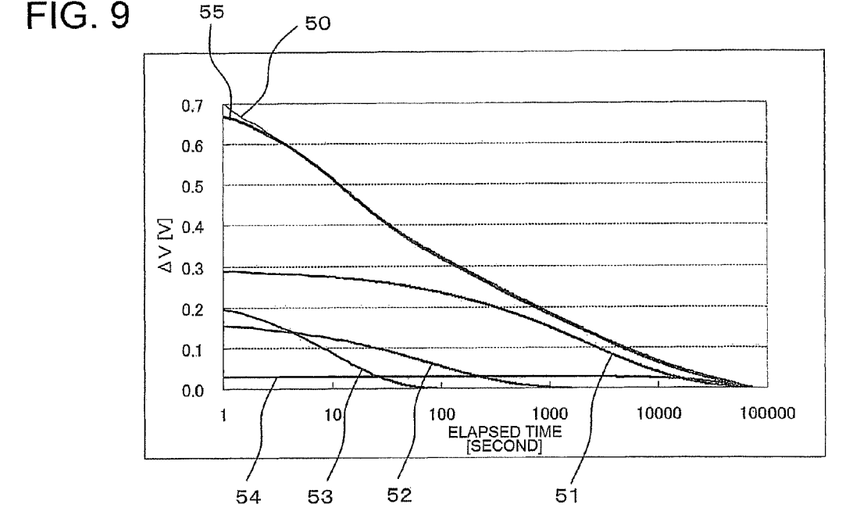
FIG. 9 is a graph showing examples of the relaxation function and relaxation function per reaction speed.

FIG. 9 shows one example of changes of each term when the relaxation function F(t) is expressed as the equation (10) as one embodiment of optimization of the relaxation function F(t) in the battery state detecting method of the embodiment.

FIG. 9 is a graph indicating changes of V(t) (=F(t)) when an axis of abscissa represents the elapsed time from the end of discharge/charge. The reference numerals 51 through 54 indicate the changes of each term (Ffast1(t), Ffast2(t) ... Fslow1(t), Fslow2($t$)) in the equation (10), respectively. Still more, the reference numeral 50 indicates a true value and the reference numeral 55 indicates a value of F(t) calculated from the equation (10) This indicates that it becomes possible to estimate ΔV(t) in high precision by using F(t) of the embodiment.

SOH1$''$ after the n-th discharge/charge will be calculated by the following equation by defining a degree of stratification of the slow reaction speed (diffusion of the electrolytic solution and others) as SOH1 in the equation (7):

$$SOH1'' = fslow''(t)/fslow^{ref}(t) * SOH1^{ref} = \{fslow1''(t) + fslow2''(t)\}/\{fslow1^{ref}(t) + fslow2^{ref}(t)\} * SOH1^{ref}$$ (Eq. 16)

In the above equation, fi$''$ (t), fi$^{ref}$(t) in the equation (7) is calculated further from the sums of two terms {fslow1$''$(t)+fslow2$''$(t)} and {fslow1$^{ref}$(t)+fslow2$^{ref}$(t)}.

As one example, 20 times, 50 times and 100 times of discharge and charge cycles have been carried out from an unused state by using a liquid-type lead battery (model size: 55D23) manufactured by Furukawa Battery Co., Ltd. And under conditions of 25° C. of environment temperature and of 10% of DOD (Depth of Discharge). Then, SOH1$''$ can be calculated by the following equations from the OCV variation fi$''$ (5 hr) when 5 hours has passed (t=5 hr) from the stop of discharge/charge based on the measured data after discharge/charge of 20 cycles, after discharge/charge of 50 cycles and after discharge/charge of 100 cycles by using the case of 20 cycles as a measure.

$$SOH1^{50} = \{fslow1^{50}(5\ hr) + fslow2^{50}(5\ hr)\}/\{fslow1^{20}(5\ hr) + fslow2^{20}(5\ hr)\} * SOH1^{20}$$ (Eq. 17)

$$SOH1^{100} = \{fslow1^{100}(5\ hr) + fslow2^{100}(5\ hr)\}/\{fslow1^{20}(5\ hr) + fslow2^{20}(5\ hr)\} * SOH1^{20}$$ (Eq. 18)

Figure 10:
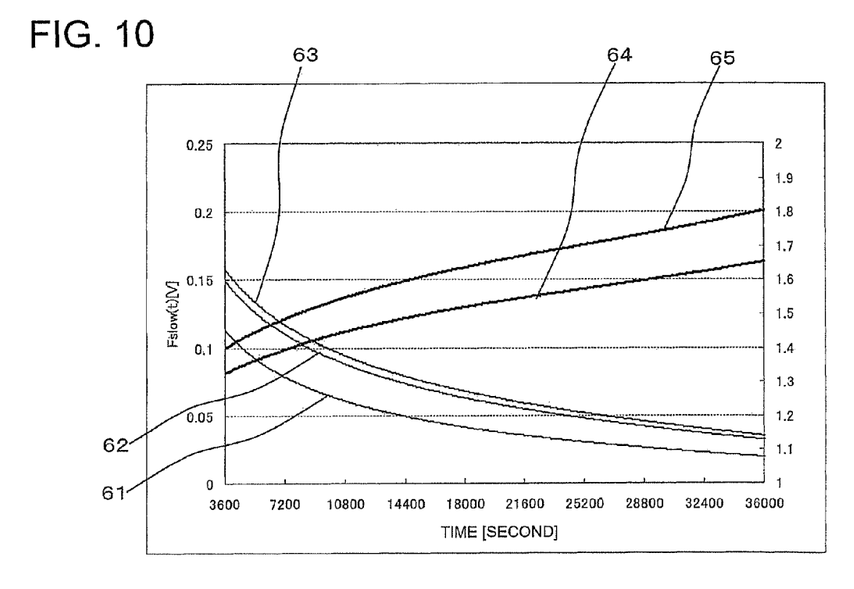
FIG. 10 is a graph showing examples of the relaxation functions per reaction speed and of their ratio.

FIG. 10 shows fslow$''$(t)/fslow$^{20}$(t) calculated from the measured data. The reference numerals 61, 62 and 63 represent fslow$^{20}$ (t), fslow$^{50}$ (t) and fslow$^{100}$ (t), respectively and the reference numerals 64 and 65 represent fslow$^{50}$ (t)/fslow$^{20}$ (t) and fslow$^{100}$ (t)/fslow (t), respectively. This graph permits to obtain a value 1.52 at a point of time t=18,000 seconds for example as follows:

$$\{fslow1^{50}(5\ hr) + fslow2^{50}(5\ hr)\}/\{fslow1^{20}(5\ hr) + fslow2^{20}(5\ hr)\} = Fslow^{50}(5\ hr)/Fslow^{20}(5\ hr) = 1.52$$

In the same manner, a value 1.63 is obtained as follows:

$$fslow^{100}(5\ hr)/fslow^{20}(5\ hr) = 1.63$$

Thus, it becomes possible to understand the changes of the state of the battery corresponding to the number of discharge/charge cycles from the variation F(t) of OCV.

Still more, the OCV when 20 hours has passed after the end of the discharge/charge turns out as follows as one example with respect to 20, 50 and 100 discharge/charge cycles:

OCV$_{20\ hr}^{20}$=[00171] 12.896 [V]
OCV$_{20\ hr}^{50}$=[00172] 13.032 [V]
OCV$_{20\ hr}^{100}$=13.036 [V]

Figure 11:
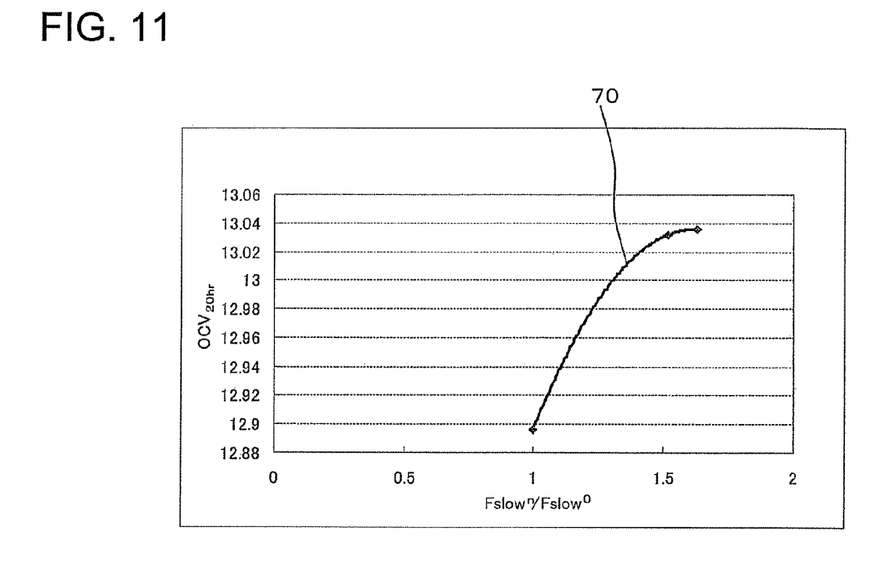
FIG. 11 is a graph showing one example of a stable OCV estimating equation.

FIG. 11 shows a relationship between fslow$''$(t)/fslow$^{20}$(t) and OCV$_{20\ hr}^{20}$. The result shown in FIG. 11 can be used in a stable OCV estimating equation for estimating OCV$_{20\ hr}$ of the same type of battery.

As described above, the invention can provide the battery state detecting method for detecting the state by evaluating the depletion caused by the reaction processes whose speeds are different. It becomes possible to accurately detect the residual capacity SOC by detecting the depletion level SOH of the battery. Thereby, it becomes possible to assure stable operation of the electric devices and to promote prediction of risk, thus having an effect of keeping safe operation of the vehicle. The invention also provides an effect of reducing an environmental burden by improving precision of the idling stop function.

It is noted that the descriptions in the embodiment indicate one exemplary battery state detecting method of the invention and the invention is not limited to them. The detailed structures and operations and others of the battery state detecting method of the embodiment can be appropriately modified within a scope not departing from the gist of the invention.

What is claimed is:

1. A battery state detecting method for estimating at least a quantity of a state of a battery, at least a state of charge (SOC) and a state of health (SOH),
wherein
the method comprises the steps of:
generating reference data associated with a reference relaxation function F$^{ref}$(t), wherein the reference relaxation function F$^{ref}$(t) approximates a variation of voltage ΔV(t) obtained by measuring values of an open circuit voltage (OCV) of the battery in a standard state of the battery during a predetermined cycle, and wherein the predetermined cycle is associated with a period from a time of completion of discharge or charge of the battery to a time when a measured value of the OCV substantially becomes constant;
forming a relaxation function F$''$(t) that approximates the variation voltage ΔV(t) based on a sum of at least a first relaxation function for a first reaction speed of the battery associated with an ion reaction and a second relaxation function for a second reaction speed of the battery associated with an electrolytic reaction; and
estimating the quantity of the state of the battery after the completion of the charge or the discharge based on the relaxation function F$''$ (t) and the reference data associated with the reference relaxation function F$^{ref}$(t), wherein the first relaxation function and the second relaxation function are optimized by dividing the variation voltage ΔV(t), which is approximated from the measured values of the OCV, into components corresponding to at least the first reaction speed and the second reaction speed, and SOC$^{ref}$ and SOHi$^{ref}$ are the SOC and an i-th SOH per reaction speed in the standard state of the battery, respectively, SOC$''$ and SOHi$''$ are the SOC and a different i-th SOH per reaction speed after the completion of an n-th charge or discharge, respectively, g(T) is a function associated with dependency on temperature T, fi$''$ (t) is an i-th relaxation function per reaction speed fi(t) included in the relaxation function F$''$(t), and fi$^{ref}$(t) is an i-th reference relaxation function per reaction speed fi(t) included in the reference relaxation function F$^{ref}$(t), and
wherein the relaxation function per reaction speed fi$''$ (t) after the completion of the n-th charge or discharge is expressed as:

$$fi''(t) = f^{ref}(t) * (SOC''/SOC^{ref}) * (SOHi''/SOHi^{ref}) * g(T).$$

2. The battery state detecting method of claim 1,
wherein the relaxation function F$''$(t) is further formed as a function of a temperature of the battery that is measured after the completion of the charge or the discharge.

3. The battery state detecting method of claim 1,
wherein the relaxation function F$''$(t) is selected from a set of relaxation functions based on diffusion of an electrolytic solution within the battery and an elapsed time associated with an operation condition of a vehicle.

4. The battery state detecting method of claim 1,
wherein the estimating further comprises estimating the quantity of the state of the battery based on other reference data associated with an initial state of the battery.

5. The battery state detecting method of claim 1,
wherein
when the temperature T and the SOC are constant, the $SOHi^n$ is expressed as:

$$SOHi^n = \{fi^n(t)/fi^{ref}(t)\} * SOHi^{ref}.$$

6. The battery state detecting method of any of claim 3, 4 or 5, comprising:
measuring voltage and current of the battery;
calculating the variation of voltage $\Delta V(t)$ at an elapsed time t after the completion of the charge or the discharge by using the measured values of the OCV measured during the predetermined cycle when the battery is determined to be stopping to charge or discharge on the basis of a predetermined charge or discharge stopping signal or the measured value of the current;
optimizing the first relaxation function associated with the first reaction speed and the second relaxation function associated with the second reaction speed based on respective time constants shorter than the elapsed time t to generate a modified first relaxation function and a modified second relaxation function; and
estimating the quantity of the state based on the modified first relaxation function, the modified second relaxation function, and a third relaxation function related to a third reaction speed associated with a time constant longer than the elapsed time t.

7. The battery state detecting method of claim 6,
wherein the battery is associated with a stopping state to discharge and charge in response to a determination that the current of the battery is less than a predetermined value of current.

8. The battery state detecting method of claim 1, comprising:
measuring voltage and current of the battery;
calculating the variation of voltage $\Delta V(t)$ at an elapsed time t after the completion of the charge or discharge by using the measured values of the OCV measured during the predetermined cycle when the battery is determined to be stopping to charge or discharge on the basis of a predetermined charge or discharge stopping signal or the measured value of the current;
optimizing the first relaxation function associated with the first reaction speed and the second relaxation function associated with the second reaction speed based on respective time constants shorter than the elapsed time t to generate a modified first relaxation function and a modified second relaxation function; and
estimating the quantity of the state based on the modified first relaxation function, the modified second relaxation function, and a third relaxation function related to a third reaction speed associated with a time constant longer than the elapsed time t.

9. The battery state detecting method of claim 8,
wherein the battery is associated with a stopping state to discharge and charge in response to a determination that the current of the battery is less than a predetermined value of current.

\* \* \* \* \*